(12) United States Patent
Groepl et al.

(10) Patent No.: US 8,258,813 B2
(45) Date of Patent: Sep. 4, 2012

(54) CIRCUIT AND METHOD FOR DRIVING AT LEAST ONE DIFFERENTIAL LINE

(75) Inventors: Martin Groepl, Sonthofen/Oberallgaeu (DE); Holger Hoeltke, München (DE)

(73) Assignee: Silicon Line GmbH, München (DE)

( * ) Notice: Subject to any disclaimer, the term of this patent is extended or adjusted under 35 U.S.C. 154(b) by 0 days.

(21) Appl. No.: 12/654,951

(22) Filed: Jan. 11, 2010

(65) Prior Publication Data

US 2010/0109794 A1 May 6, 2010

Related U.S. Application Data

(63) Continuation of application No. PCT/EP2008/059168, filed on Jul. 14, 2008.

(30) Foreign Application Priority Data

Jul. 12, 2007 (DE) .................. 10 2007 032 876

(51) Int. Cl.
H03K 19/0175 (2006.01)
H03K 17/16 (2006.01)
(52) U.S. Cl. .......................... 326/82; 326/30
(58) Field of Classification Search ............ 326/82, 326/83, 86, 27, 30; 327/108, 563
See application file for complete search history.

(56) References Cited

U.S. PATENT DOCUMENTS

| 5,012,384 A | 4/1991 | Chew |
| 5,019,769 A | 5/1991 | Levinson |
| 5,672,994 A | 9/1997 | Au et al. |
| 5,834,813 A | 11/1998 | Ma et al. |
| 5,949,253 A * | 9/1999 | Bridgewater, Jr. ............. 326/86 |
| 6,031,855 A | 2/2000 | Watanabe |
| 6,650,143 B1 | 11/2003 | Peng |
| 6,667,661 B1 | 12/2003 | Liu et al. |
| 6,812,733 B1 | 11/2004 | Plasterer et al. |
| 6,965,722 B1 | 11/2005 | Nguyen |
| 6,975,135 B1 * | 12/2005 | Bui ................................ 326/29 |
| 7,133,429 B2 | 11/2006 | Moran |
| 7,154,923 B2 | 12/2006 | Kucharski |

(Continued)

FOREIGN PATENT DOCUMENTS

DE  10 2004 032456 B3  4/2006

(Continued)

OTHER PUBLICATIONS

PCT "Schriftlicher Bescheid" [Written Opinion], dated Nov. 17, 2008 in PCT/EP2008/059168, filed Jul. 14, 2008 (2 pages).

(Continued)

*Primary Examiner* — Daniel D Chang
(74) *Attorney, Agent, or Firm* — Shlesinger, Arkwright & Garvey LLP (57) ABSTRACT

In the case of a circuit arrangement which can be supplied by way of at least one voltage source, in particular a driver output stage, for driving at least one differential line which can be connected to at least one first output connection as well as to at least one second output connection for the purpose of, in particular digital, data transmission, wherein the circuit arrangement has at least two paths which are arranged in a mirror-image fashion relative to one another and which connect the voltage source to at least one reference potential, in particular earth potential or ground potential or zero potential, as well as in the case of a method for driving at least one differential line using at least one such circuit arrangement, an increased output impedance is avoided during the switching phase, and this ensures high signal quality.

21 Claims, 6 Drawing Sheets

U.S. PATENT DOCUMENTS

| | | | |
|---|---|---|---|
| 7,173,851 | B1 | 2/2007 | Callahan et al. |
| 7,272,067 | B1 | 9/2007 | Huang et al. |
| 7,280,425 | B2 | 10/2007 | Keshavarzi et al. |
| 7,595,661 | B2 * | 9/2009 | Kim .................. 326/82 |
| 2002/0117724 | A1 | 8/2002 | Ariyoshi et al. |
| 2003/0058725 | A1 | 3/2003 | Bell |
| 2003/0094977 | A1 | 5/2003 | Li et al. |
| 2004/0160996 | A1 | 8/2004 | Giorgi et al. |
| 2004/0195978 | A1 | 10/2004 | Horiuchi et al. |
| 2004/0208011 | A1 | 10/2004 | Horiuchi et al. |
| 2005/0185428 | A1 | 8/2005 | Crawford et al. |
| 2007/0291807 | A1 | 12/2007 | Uesaka |
| 2008/0007985 | A1 | 1/2008 | Wilcox |
| 2008/0012507 | A1 | 1/2008 | Nalbant |
| 2008/0304527 | A1 | 12/2008 | Gao et al. |

FOREIGN PATENT DOCUMENTS

| | | | |
|---|---|---|---|
| EP | 0 798 828 | A | 10/1997 |
| EP | 1 777 708 | A1 | 4/2007 |
| EP | 1 816 723 | A2 | 8/2007 |
| FR | 2 889 643 | A | 2/2007 |
| GB | 2 365 788 | A | 2/2002 |
| WO | WO2007/069104 | A | 6/2007 |
| WO | WO2008/050779 | A | 5/2008 |

OTHER PUBLICATIONS

PCT "International Search Report", dated Nov. 17, 2008 in PCT/EP2008/059168, filed Jul. 14, 2008 (2 pages).
U.S. Appl. No. 12/654,514, filed Dec. 2009, Groepl.
U.S. Appl. No. 12/654,515, filed Dec. 2009, Groepl et al.
PCT English language International Preliminary Report on Patentability and Written Opinion of the International Searching Authority (ISA), dated Feb. 9, 2010, in PCT/EP2008/059168, filed Jul. 14, 2008 (8 pages).
U.S. Appl. No. 12/901,515, filed Oct. 2010, Groepl et al.
U.S. Appl. No. 12/950,766, filed Nov. 2010, Groepl et al.
U.S. Appl. No. 13/083,282, filed Apr. 2011, Groepl et al.

* cited by examiner

PRIOR ART

Fig. 2B

PRIOR ART

Fig. 2C

PRIOR ART

Fig. 2D

PRIOR ART

US 8,258,813 B2

CIRCUIT AND METHOD FOR DRIVING AT LEAST ONE DIFFERENTIAL LINE

CROSS-REFERENCE TO RELATED APPLICATIONS

This application is a continuation of application no. PCT/EP2008/059168, filed Jul. 14, 2008, which claims the priority of German application no. 10 2007 032 876.3, filed Jul. 12, 2007, and each of which is incorporated herein by reference.

FIELD OF THE INVENTION

The present invention relates to the technical field of driving lines having a specific line impedance for the purpose of, in particular digital, data transmission from at least one data source, for example, from at least one first integrated circuit, to at least one data sink, for example, to at least one second integrated circuit.

More specifically, the present invention relates to a circuit arrangement or circuit, in particular a driver output stage, and a method for driving at least one differential line by use of at least one such circuit.

Within the scope of the present invention, the term "negligible" is understood as about one percent of the output impedance which the circuit arrangement, in particular the driver output stage, has on the output side; the term "non-negligible" is understood as more than about ten percent of the output impedance which the circuit arrangement, in particular the driver output stage, has on the output side.

BACKGROUND OF THE INVENTION

During the transmission of low data rates, impedance matching between the driver and the line is generally not usual or frequently not necessary. In this case, frequently only simple inverter circuits are used; cf. first circuit arrangement according to the PRIOR ART illustrated as an example by reference to FIG. 2A.

Figure 2A:
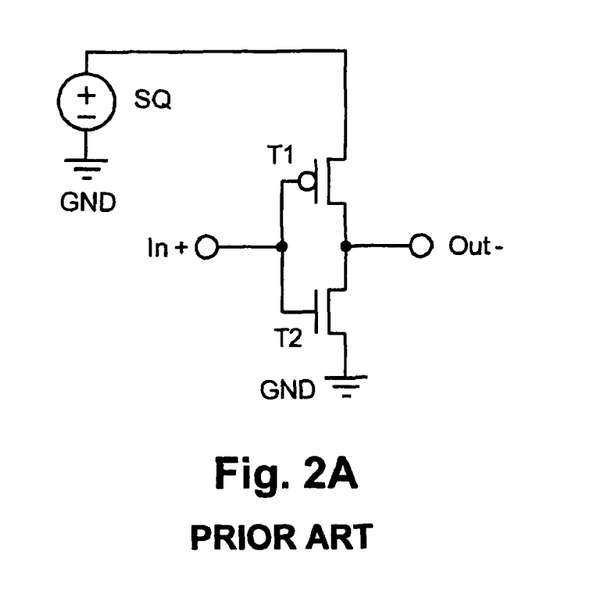
FIG. 2A in a schematic diagram a first example of a circuit arrangement from the PRIOR ART operating according to a first method from the PRIOR ART.

The known circuit arrangement according to FIG. 2A has an output node (=single-ended); the transistor (in FIG. 2A, that is the upper) allocated to the voltage source SQ comprises a p-channel transistor, the transistor (in FIG. 2A, that is the lower) allocated to the reference potential (=for example, earth potential or zero potential or ground) comprises an n-channel transistor.

In order to transmit high data rates with low error, the impedance of the output stage or output impedance $Z_{out}$ of line driver is typically matched to the line input impedance $Z_L$ (matching: $Z_{Out}=Z_L$=for example, fifty Ohms). As a result of such impedance matching, signal reflections are absorbed which would otherwise adversely affect the quality of the transmission signal.

Furthermore, high data rates are frequently transmitted as differential signals in order to minimize interference; examples of this are LVDS (=Low Voltage Differential Signaling), SLVS (=Scalable Low Voltage Signaling), differential ECL (=Emitter Coupled Logic), differential LVPECL (=Low Voltage Positive Emitter Coupled Logic) or similar.

In these differential circuits there is no longer only one output node (=so-called single-ended arrangement) but a differential output stage.

Figure 2B:
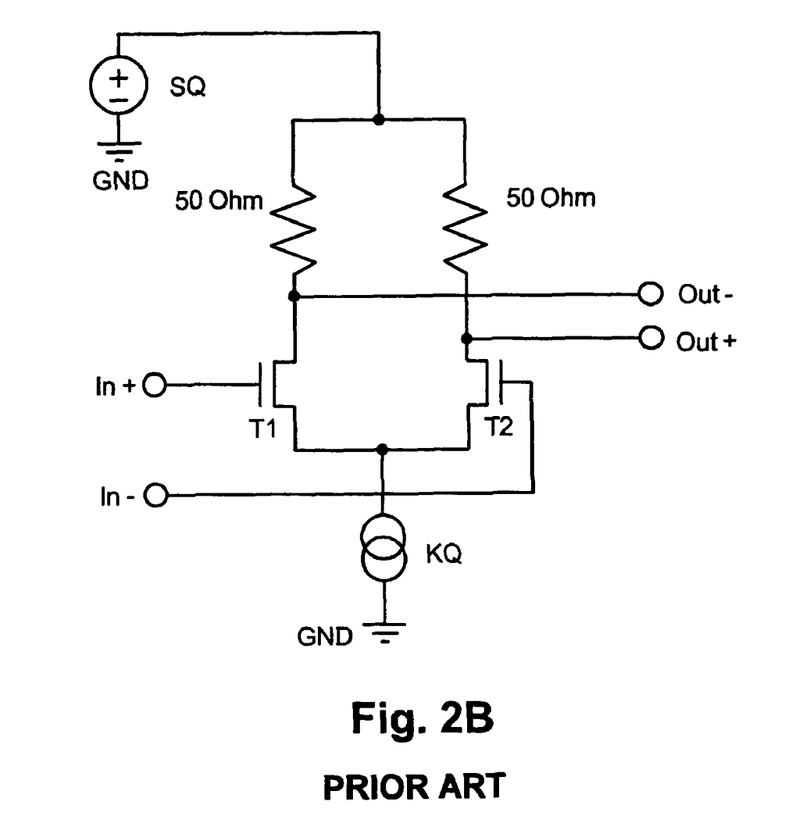
FIG. 2B in a schematic diagram a second example of a circuit arrangement from the PRIOR ART operating according to a second method from the PRIOR ART.
Figure 2C:
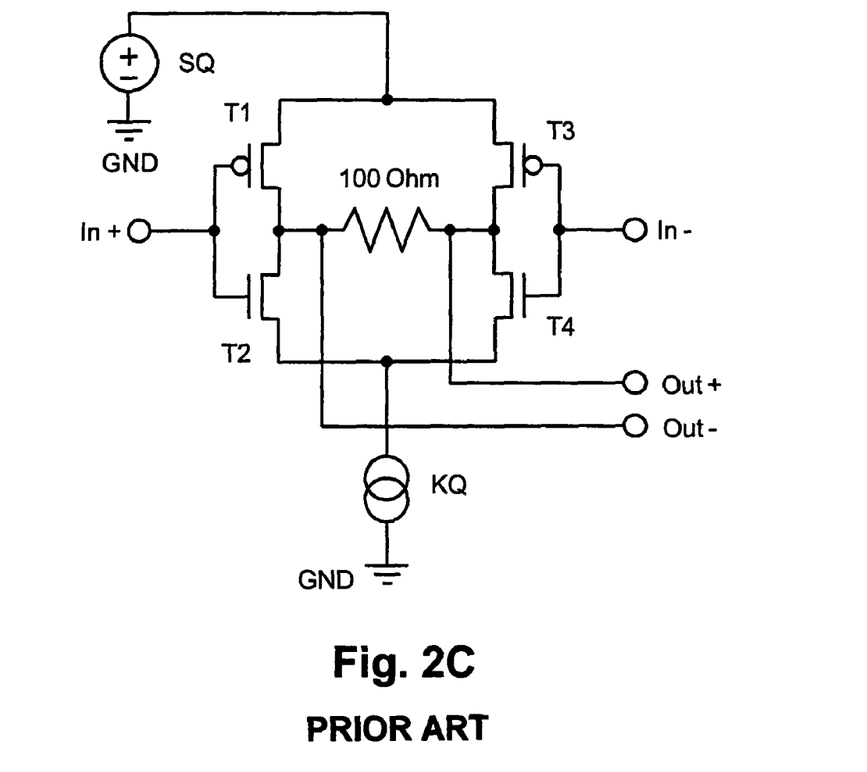
FIG. 2C in a schematic diagram a third example of a circuit arrangement from the PRIOR ART operating according to a third method from the PRIOR ART.
Figure 2D:
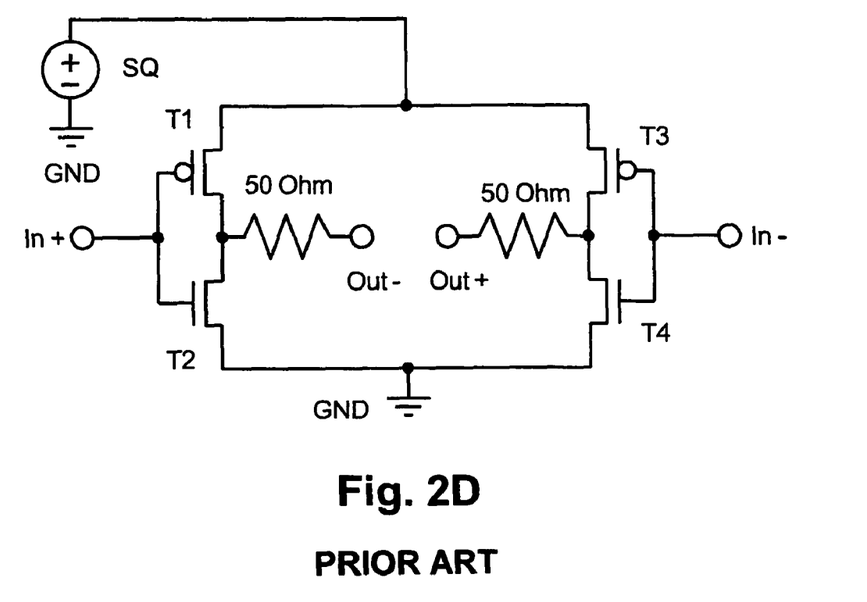
FIG. 2D in a schematic diagram a fourth example of a circuit arrangement from the PRIOR ART operating according to a fourth method from the PRIOR ART.

This means that interference with respect to the reference potential, for example, with respect to the earth potential or with respect to the zero potential or with respect to ground no longer have an effect since such interference is mutually compensated by forming a difference in the two output signals; cf. differential circuit arrangements according to the PRIOR ART illustrated as an example by reference to FIG. 2B, FIG. 2C, FIG. 2D.

In FIG. 2B, the voltage source SQ (idealised, having a negligible impedance) delivers about 1.2 Volt; the two load resistances each of fifty Ohms as an example (in each case, with respect to the reference potential, for example, with respect to the earth potential or with respect to the zero potential or with respect to ground) serve as output impedance so that about one hundred Ohms in total lies between Out + and Out −; the input signal at In − has a phase shift of 180 degrees with respect to the input signal at In +.

If the gate voltage $V_G1$ at the first n-channel transistor T1 [the gate connection of T1 is assigned to the first input connection In +] is smaller than the sum of the source voltage $V_S1$ and the transistor threshold voltage $V_{thN}$ [the source connection of T1 is constant current source KQ (idealized having a negligible impedance) and is assigned to the source connection of the second n-channel transistor T2], the n-channel transistor T1 has a high resistance and is in the off-state; accordingly, this first n-channel transistor T1 opens and conducts if the gate voltage $V_G1$ at this first n-channel transistor T1 is higher than the sum of the source voltage $V_S1$ and the transistor threshold voltage $V_{thN}$.

The differential circuit arrangement in FIG. 2B implements a changeover switch which allows a hard switching, wherein in each case one of the two load resistance nodes is pulled downwards. A disadvantage of the differential circuit arrangement according to FIG. 2B, however, is in particular the very low power efficiency due to a current efficiency of only about 25 percent, that is only about 25 percent of the current taken from the supply voltage source SQ flows in the data line to be driven. In order to achieve the desired current amplitude on the data line, four times as much current must be taken from the supply voltage.

In FIG. 2C the voltage source SQ (idealized having a negligible impedance) delivers about 2.5 Volt; whereas the two transistors T2 and T4 comprise n-channel transistors, the two transistors T1 and T3 are each a p-channel transistor which has a high resistance and is in the off-state when the gate voltage $V_G3$ [the gate connection of T1 is assigned to the first input connection In +; the gate connection of T3 is assigned to the second input connection In −] is higher than the sum of the source voltage $V_S3$ and the transistor threshold voltage $V_{thP}$ [the source connection of T1 or of T3 is assigned to the voltage source SQ]; accordingly, the p-channel transistor T1 or T3 opens as result of negligible resistance when the gate voltage at T1 or T3 is smaller than the sum of the source voltage $V_S3$ and the transistor threshold voltage $V_{thP}$.

However, a disadvantage of the differential circuit arrangement according to FIG. 2C linking to the inverter circuit from FIG. 2A in terms of principle is in particular the low power efficiency of only about fifty percent, that is the supply current taken from the voltage supply is about twice as high as the available output current.

In FIG. 2D the two load resistances each of fifty Ohms for example have a terminating function (in practice the two load resistances are each only about 47 Ohms since the transistors have a low residual resistance of about three Ohms in each case so that the differential circuit arrangement according to FIG. 2D has inadequacies in regard to the precision of the termination).

In fact, the differential circuit arrangement according to FIG. 2D has a very high power efficiency (current efficiency: almost one hundred percent); one particular disadvantage of the differential circuit arrangement according to FIG. 2D however is that impedance mismatches occur during the switching phases.

In this context, it should be considered that in order to minimize interference at the usually high data rates at which the differential signals are transmitted, the switching phases can account for about twenty percent up to about thirty percent of the entire time [ideal 0 and 1 pulses assumed in theory do not exist in reality, that is a slope rise or fall should be observed between the 0 state (off state) and the 1 state (on state)].

In other words, this means that the rise times and the fall times at high data rates are definitely relevant (and in the sense of the E[lectro]M[agnetic]C[ompatibility] even not completely undesired; in the case of ideal, that is infinitely steep slopes [negligible time difference], an [after Fourier transformation] infinitely high number of interference frequencies would appear.

If the gate voltage present at the p-channel transistor T1 and at the n-channel transistor T2 (simultaneously) falls, for example, from 1.2 Volt to 0 Volt, the p-channel transistor T1 does not yet respond until about the middle phase of the decreasing voltage, that is for example, at about 0.6 Volt whereas the n-channel transistor T2 is already beginning to turn off, that is, has a substantially increasing impedance, in the middle phase of the decreasing voltage, that is at 0.6 Volt for example. This results in a significantly increased output impedance during the switching slope, causing a deterioration in the reflection attenuation and the signal quality.

OBJECTS AND SUMMARY OF THE INVENTION

Starting from the previously outlined disadvantages and inadequacies and acknowledging the outlined prior art, it is the object of the present invention to further develop a circuit arrangement of the type specified initially and a method of the type specified initially so that an increased output impedance is avoided during the switching phase and this ensures high signal quality.

This object is achieved
by a circuit arrangement, comprising:
a) the circuit being configured for being supplied by at least one voltage source for driving at least one differential line which can be connected to at least one first output connection and to at least one second output connection for the purpose of, in particular digital, data transmission;
b) the circuit having at least two paths which are arranged in a mirror-image fashion relative to one another and which connect the at least one voltage source to at least one reference potential, in particular earth potential or ground potential or zero potential;
c) the first path including:
  i) at least one first transistor, in particular at least one first n-channel MOSFET, whose gate connection is assigned to at least one first input connection, in particular to at least one first input connection which can be acted upon by at least one first control voltage; and
  ii) at least one second transistor, in particular at least one second n-channel MOSFET whose gate connection, is assigned to at least one second input connection, in particular to at least one input connection which can be acted upon by at least one second control voltage, and the first output connection is connected, in particular via at least one first node, between the first transistor and the second transistor;
d) the second path including:
  i) at least one third transistor, in particular at least one third n-channel MOSFET, whose gate connection is assigned to at least one third input connection, in particular to at least one third input connection which can be acted upon by at least one third control voltage; and
  ii) at least one fourth transistor, in particular at least one fourth n-channel MOSFET whose gate connection, is assigned to at least one fourth input connection, in particular to at least one fourth input connection which can be acted upon by at least one fourth control voltage, and the second output connection is connected, in particular via at least one second node, between the third transistor and the fourth transistor;
e) in the first path there is provided:
  i) at least one first drain degradation resistance which is connected between the voltage source and the first transistor, which is in particular assigned to the drain connection of the first transistor; and/or
  ii) at least one first separating resistance which is connected between the first transistor and the first output connection, which is in particular assigned to the source connection of the first transistor and at least one second separating resistance which is connected between the second transistor and the first output connection, which is in particular assigned to the drain connection of the second transistor;
f) in the second path there is provided:
  i) at least one second drain degradation resistance which is connected between the voltage source and the third transistor, which is in particular assigned to the drain connection of the third transistor; and/or
  ii) at least one third separating resistance which is connected between the third transistor and the second output connection, which is in particular assigned to the source connection of the third transistor and at least one fourth separating resistance which is connected between the fourth transistor and the second output connection, which is in particular assigned to the drain connection of the fourth transistor, in particular by a power-efficient line driver having a controlled output impedance and by a method, for driving at least one differential line by use of at least one circuit as set forth immediately above, wherein:
a) in the range of positive full-signal operation:
  i) the first transistor and the fourth transistor are located in the linear region and conduct; and
  ii) the second transistor and the third transistor are in the off-state;
b) in the range of negative full-signal operation:
  i) the first transistor and the fourth transistor are in the off-state; and
  ii) the second transistor and the third transistor are located in the linear region and conduct; and
c) in the transition range between positive full-signal operation and negative full-signal operation:
  i) due to decrease of the input voltage at the first input connection, the operating point of the first transistor changes from operation in the linear region to operation, in particular as a source follower, in saturation;
  ii) the second transistor operating in particular in a regular source circuit, still remains in saturation when the input voltage at the second input connection increases as far as about the central point of the transition range;
  iii) the third transistor operating in particular in a regular source circuit, still remains in saturation when the input voltage at the third input connection increases as far as about the central point of the transition range; and iv) due to a decrease in the input voltage at the fourth input connection, the operating point of the fourth transistor changes from operation in the linear region to operation, in particular as a source follower, in saturation, in particular by a method for driving at least one differential line for the purpose of low-reflection and error-free digital transmission.

Advantageous embodiments and expedient further developments of the present invention are characterized in the respective dependent claims.

The present circuit arrangement, which operates according to the method of the present invention can be connected downstream of at least one light-sensitive component, for example, at least one photodiode, in particular located at the termination or at the end of at least one carrier medium such as at least one glass fiber, at least one synthetic fiber or air.

The present invention is advantageously used in at least one, in particular mobile, telecommunication system, for example in at least one communication device, such as in at least one mobile telephone, in at least one, in particular mobile, data communication system or in at least one, in particular mobile, data processing device, for example in at least one handheld, in at least one notebook or in at least one P[ersonal]D[igital]A[ssistant], in at least one, in particular mobile, data recording and/or reproducing device, for example in at least one camcorder, in at least one digital camera or in at least one H[igh]D[efinition]T[ele]V[ision] or in at least one transportation means, for example in at least one driver assistance system or in at least one navigation system of an automobile.

BRIEF DESCRIPTION OF THE DRAWINGS

As has already been discussed hereinbefore, there are various possibilities for configuring and further developing the teaching of the present invention in an advantageous manner. For this purpose, further embodiments, features and advantages of the present invention are explained in detail hereinafter inter alia with reference to the four exemplary embodiments illustrated by FIG. 1A, by FIG. 1B, by FIG. 1C and by FIG. 1D.

It is shown in.

The same or similar embodiments, elements or features are provided with identical reference numerals in FIG. 1A to FIG. 2D.

DETAILED DESCRIPTION OF THE INVENTION

Figure 1A:
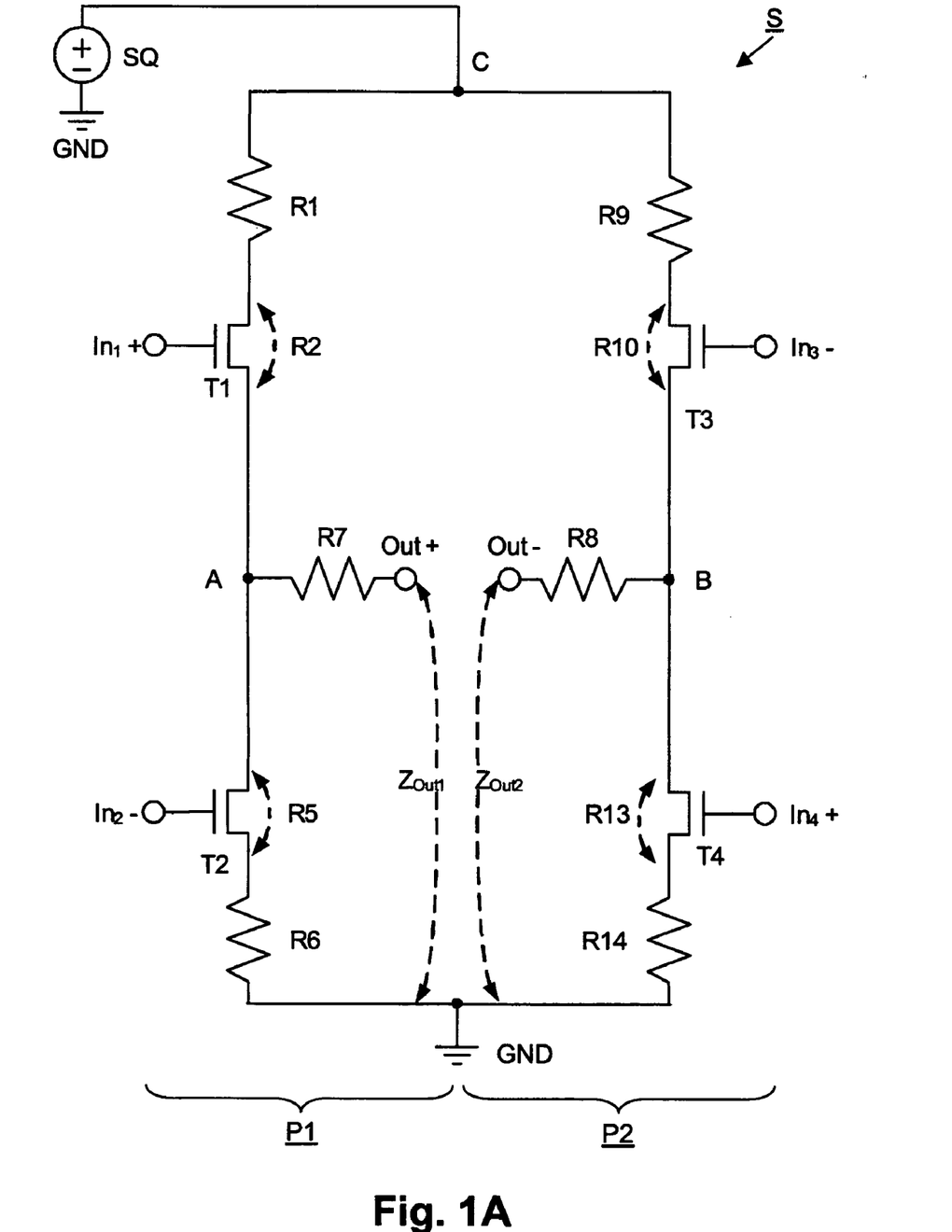
FIG. 1A in a schematic diagram a first exemplary embodiment of a circuit arrangement according to the present invention operating according to the method of the present invention.
Figure 1B:
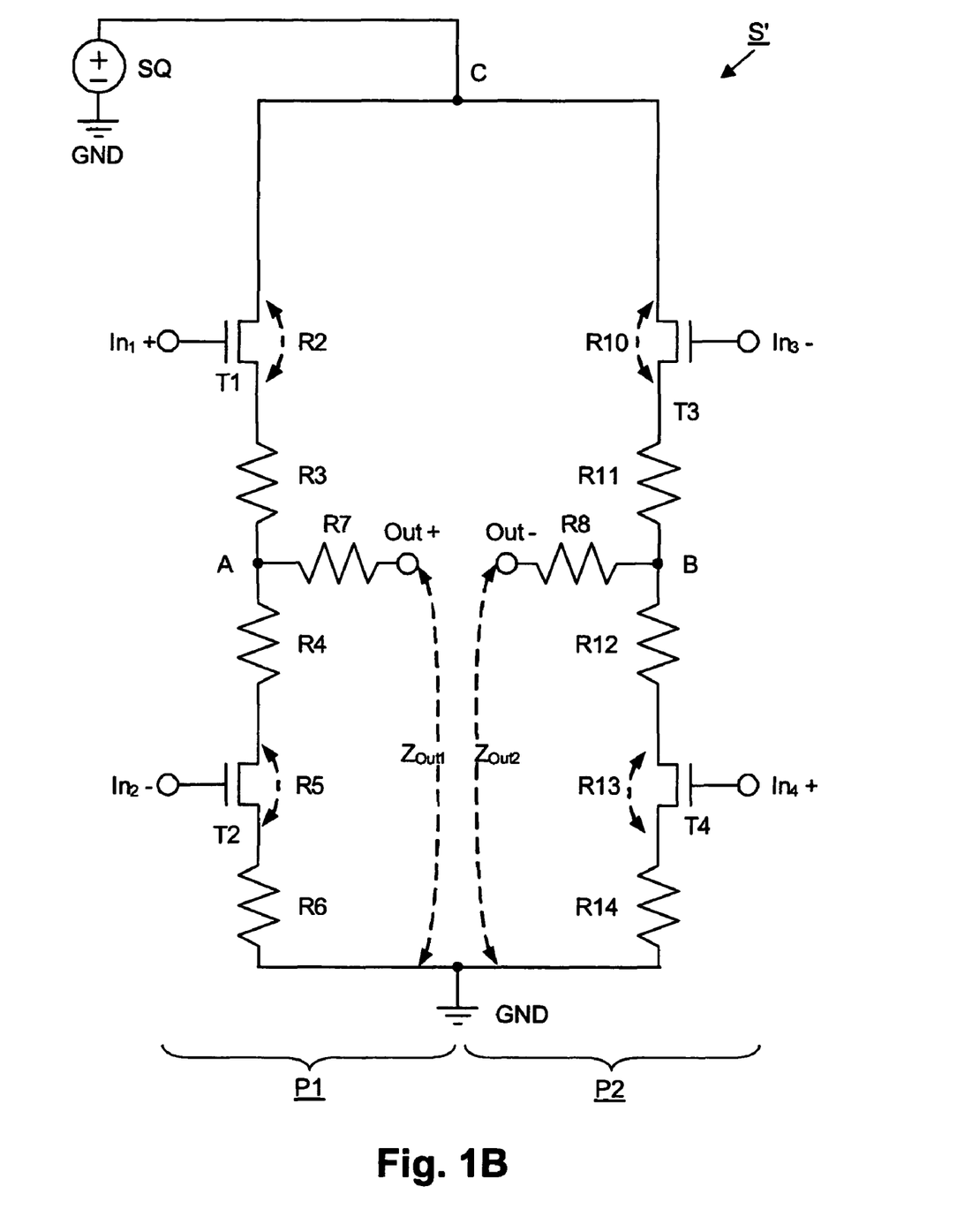
FIG. 1B in a schematic diagram a second exemplary embodiment of a circuit arrangement according to the present invention operating according to the method of the present invention.
Figure 1C:
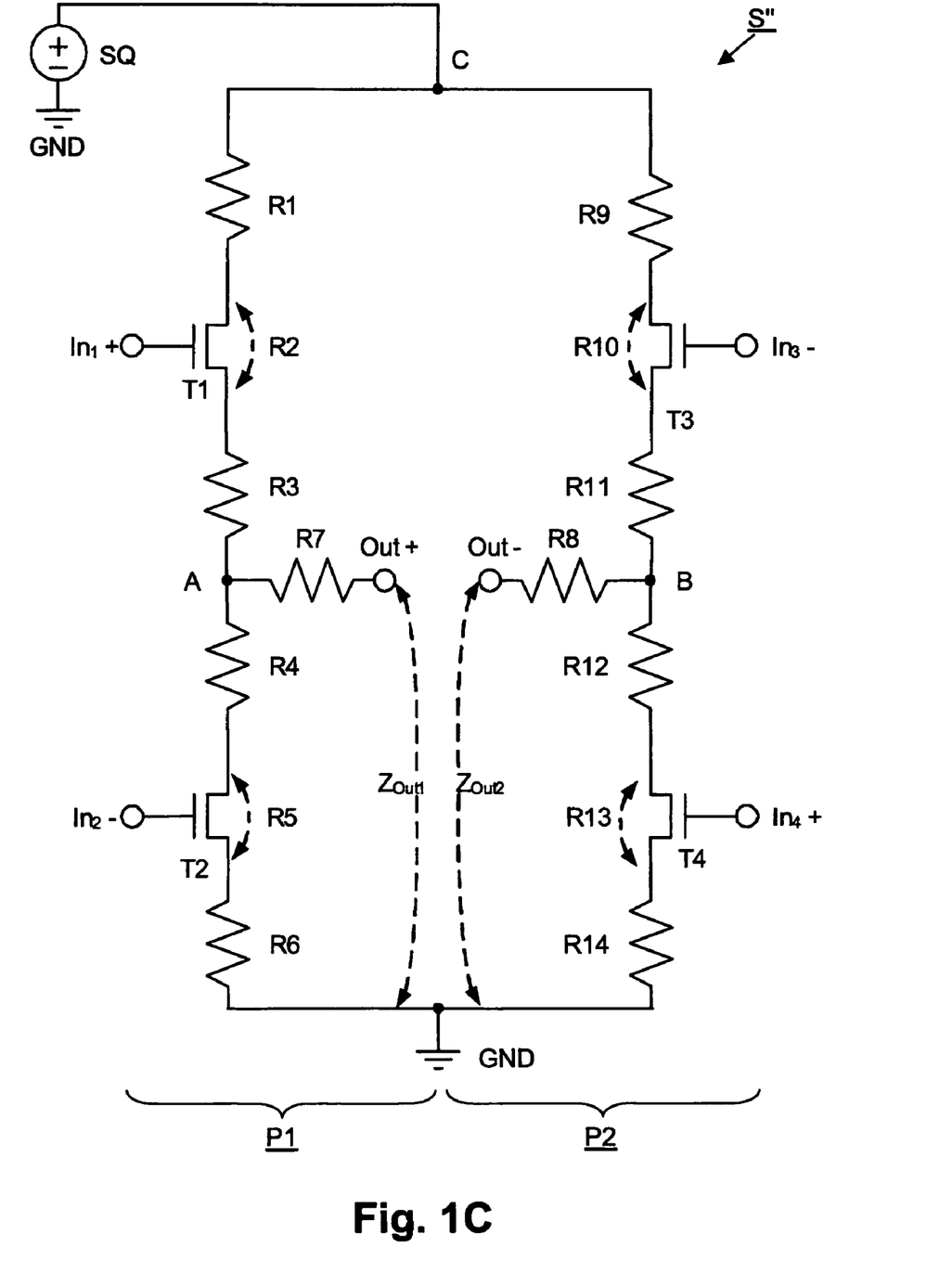
FIG. 1C in a schematic diagram a third exemplary embodiment of a circuit arrangement according to the present invention operating according to the method of the present invention.
Figure 1D:
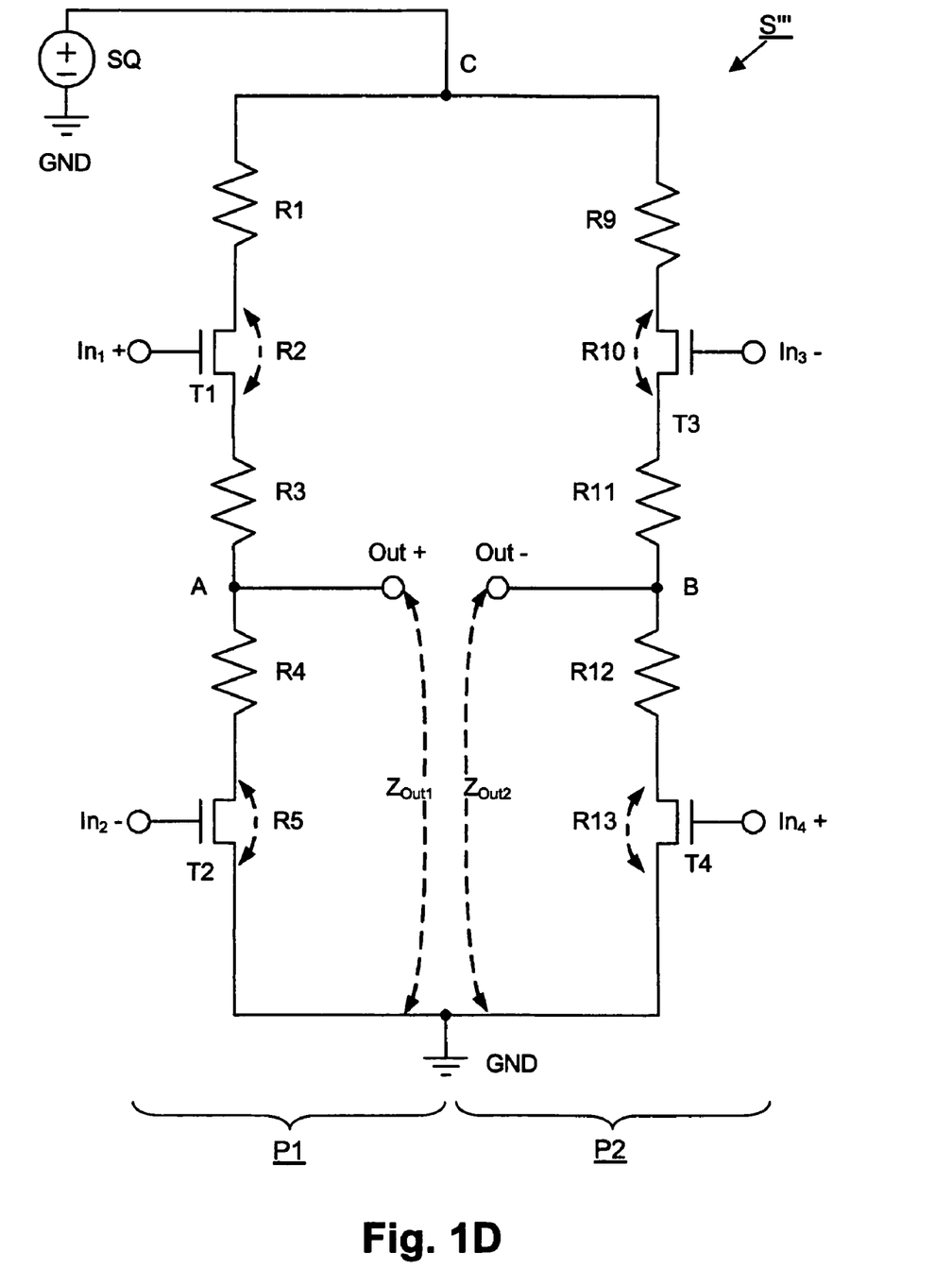
FIG. 1D in a schematic diagram a fourth exemplary embodiment of a circuit arrangement according to the present invention operating according to the method of the present invention.

In order to avoid superfluous repetitions, the following explanations regarding the embodiments, features and advantages of the present invention—unless specified otherwise—relate both to the first exemplary embodiment of a circuit arrangement S according to the present invention shown in FIG. 1A also to the second exemplary embodiment of a circuit arrangement S' according to the present invention shown in FIG. 1B also to the third exemplary embodiment of a circuit arrangement S" according to the present invention shown in FIG. 1C and also to the fourth exemplary embodiment of a circuit arrangement S'" according to the present invention shown in FIG. 1D.

Before the operating mode of the (driver output) circuit arrangement S (cf. FIG. 1A), S' (cf. FIG. 1B), S" (cf. FIG. 1C), S'" (cf. FIG. 1D) is explained hereinafter, the design and structure of these circuits S, S', S", S'" is first set out:

The driver output circuits S, S', S", S'" are supplied with voltage or with current by means of a voltage source SQ connected between a reference potential GND (=for example, earth potential or mass potential or zero potential) and a third node C (=third branch C) and are intended for driving a differential line which can be connected to a first output connection Out + and to a second output connection Out – for the purpose of digital data transmission.

Starting from node point C, the circuit arrangement S, S', S", S'" has two paths P1, P2 which are arranged in a mirror-image fashion relative to one another and which connect the voltage source SQ to the reference potential GND.

In this case, the first path P1 comprises a first transistor T1 in the form of an n-channel MOSFET (MOSFET=metal oxide semiconductor field-effect transistor), whose gate connection is assigned to a first input connection $In_1+$ which is acted upon by a first control voltage;

a second transistor T2 in the form of another n-channel MOSFET whose gate connection is assigned to a second input connection $In_2-$ which is acted upon by a second control voltage, wherein the first output connection Out + is connected via a first node A (=first branch A) between the first transistor T1 and the second transistor T2.

In mirror-image fashion the second path P2 comprises a third transistor T3 in the form of another n-channel MOSFET, whose gate connection is assigned to a third input connection $In_3-$ which is acted upon by a third control voltage;

a fourth transistor T4 in the form of another n-channel MOSFET whose gate connection is assigned to a fourth input connection $In_4+$ which is acted upon by a fourth control voltage, wherein the second output connection Out – is connected via a second node B (=second branch B) between the third transistor T3 and the fourth transistor T4.

In the first exemplary embodiment of the present invention illustrated by reference to FIG. 1A, a first drain degradation resistance R1, for example, of about twenty Ohms, connected between the node point C and the drain connection of the first transistor T1 is disposed in the first path P1.

In mirror-image fashion, in the first exemplary embodiment of the present invention illustrated by reference to FIG. 1A, a second drain degradation resistance R9, for example, of about twenty Ohms, connected between the node point C and the drain connection of the third transistor T3 is placed in the second path P2.

These two drain degradation resistances R1 or R9 are only effective as an impedance for the respective output connections Out + or Out – when the first transistor T1 or the third transistor T3 is transferred into a very low-resistance, fully conducting operating state (=operation outside saturation) by a correspondingly high voltage at the respective gate connection. This avoids the reduction in the respective total output impedance $Z_{Out1}$ or $Z_{Out2}$ which would occur otherwise.

In the second exemplary embodiment of the present invention illustrated by reference to FIG. 1B, a first separating resistance R3 connected between the source connection of the first transistor T1 and the first output connection Out + and a second separating resistance R4 connected between the drain connection of the second transistor T2 and the first output connection Out + are located in the first path P1.

The separating or split(ting) resistances R3, R4 can separate or split the first transistor T1 and the second transistor T2 and whilst retaining the desired first output impedance $Z_{Out1}$, the value of the first output series resistance R7 connected between the first node A and the first output connection Out + (having the first output impedance $Z_{Out2}$) can be lowered; in particular, the two separating resistances R3 and R4 serve to reduce transverse currents (so-called shoot-through currents) flowing during the switching phase and to reduce the first output impedance $Z_{Out1}$ in the switching phase.

In a mirror-image fashion a third separating resistance R11 connected between the source connection of the third transistor T3 and the second output connection Out – and a fourth separating resistance R12 connected between the drain connection of the fourth transistor T4 and the second output connection Out – are located in the second path P2.

The separating or split(ting) resistances R11, R12 can separate or split the third transistor T3 and the fourth transistor T4 and whilst retaining the desired second output impedance $Z_{Out2}$, the value of the second output series resistance R8 connected between the second node B and the second output connection Out – (having the second output impedance $Z_{Out2}$) can be lowered; in particular, the two separating resistances R11 and R12 serve to reduce transverse currents (so-called shoot-through currents) flowing during the switching phase and to reduce the second output impedance $Z_{Out2}$ in the switching phase.

Whereas in the first exemplary embodiment of the present invention illustrated by reference to FIG. 1A, the separating resistances R3, R4 or R11, R12 are to a certain extent negligible, which should be understood within the scope of the present invention as a resistance or impedance of less than about one percent of the respective output impedance $Z_{Out1}$ or $Z_{Out2}$, in the second exemplary embodiment of the present invention illustrated by reference to FIG. 1B, the drain degradation resistances R1 or R9 are to a certain extent negligible.

In the third exemplary embodiment of the present invention illustrated by reference to FIG. 1C, neither the drain degradation resistances R1 or R9 nor the separating resistances R3, R4 or R11, R12 are negligible; rather, both the drain degradation resistances R1, R9 and also the four separating resistances R3, R4, R11, R12 are non-negligible, which should be understood within the scope of the present invention as a resistance or impedance of more than about ten percent of the respective output impedance $Z_{Out1}$ or $Z_{Out2}$.

As can be further deduced from the respective diagram in FIG. 1A or FIG. 1B or FIG. 1C, the first path P1 of the differential circuit arrangement S or S' or S" has a source degradation resistance R6 connected between the source connection of the second transistor T2 and the reference potential GND.

As can be further deduced from the respective diagram in FIG. 1A or FIG. 1B or FIG. 1C, in mirror-image fashion the second path P2 of the differential circuit arrangement S or S' or S" has a second source degradation resistance R14 connected between the source connection of the fourth transistor T4 and the reference potential GND.

The first source degradation resistance R6 or the second source degradation resistance R14 can, however, go to zero, that is vanish, if the dimensioning of the differential circuit arrangement S''', as shown in the fourth exemplary embodiment of a circuit arrangement S''' according to the present invention illustrated by reference to FIG. 1D, is effected via the two n-channel MOSFETs T1, T2 in the first path P1 or via the two re-channel MOSFETs T3, T4 in the second path P2.

As can be further deduced from the respective diagram in FIG. 1A or FIG. 1B or FIG. 1C, the left-hand part of the differential circuit arrangement S or S' or S' in FIG. 1A or FIG. 1B or FIG. 1C has a first output series resistance R7 which is connected between the source connection of the first transistor T1, the drain connection of the second transistor T2 and the first output connection Out +, and which is assigned to the first node A.

As can be further deduced from the respective diagram in FIG. 1A or FIG. 1B or FIG. 1C, in mirror-image fashion, the left-hand part of the differential circuit arrangement S or S' or S' in FIG. 1A or FIG. 1B or FIG. 1C has a second output series resistance R8 which is connected between the source connection of the third transistor T3, the drain connection of the fourth transistor T4 and the second output connection Out –, and which is assigned to the second node B.

This first output series resistance R7 or this second output series resistance R8 can, however, go to zero, that is vanish, if the respective separating resistances R3, R4 in the first path P1 or the respective separating resistances R11, R12 in the second path P2 are selected to be sufficiently high to achieve the desired total output impedance $Z_{Out1}$ or $Z_{Out2}$.

The (driver output) circuit S (cf. FIG. 1A), S' (cf. FIG. 1B), S'' (cf. FIG. 1C), S''' (cf. FIG. 1D) functions as follows:

In the case of positive full-signal operation, that is whilst the respective control voltage is $In_1+=1.2$ Volt, $In_2-=0$ Volt, $In_3-=0$ Volt, $In_4+=1.2$ Volt, the first n-channel transistor T1 as well as the (somewhat smaller as a result of the minimal voltage difference) fourth re-channel transistor T4 conduct and are located in the linear region, that is the drain source voltage is lower than the saturation voltage, the saturation voltage being given as the drain source voltage minus the threshold voltage $V_{th}$, and the second n-channel transistor T2 and the third n-channel transistor T3 are in the off-state.

The output impedances $Z_{Out1}$, $Z_{Out2}$ of the line driver S (cf. FIG. 1A), S' (cf. FIG. 1B), S" (cf. FIG. 1C) are obtained as $$Z_{Out1}=R1+R2+R3+R7=Z_{L1} \text{ and}$$

$$Z_{Out2}=R8+R12+R13+R14=Z_{L2}$$

where $Z_{L1}+Z_{L2}=Z_L$, wherein, for example, $Z_{L1}=50$ Ohms and $Z_{L2}=50$ Ohms.

In the case of negative full-signal operation, that is whilst the control voltage has the reversed polarity, i.e. for example $In_1+=0$ Volt, $In_2-=1.2$ Volt, $In_3-=1.2$ Volt, $In_4+=0$ Volt, the first n-channel transistor T1 and the fourth n-channel transistor T4 are in the off-state, and the second n-channel transistor T2 and the third n-channel transistor T3 are conducting and are located in the linear region, that is the drain source voltage is lower than the saturation voltage, the saturation voltage being given as the drain source voltage minus the threshold voltage $V_{th}$.

The output impedances $Z_{Out1}$, $Z_{Out2}$ of the line driver S (cf. FIG. 1A), S' (cf. FIG. 1B), S" (cf. FIG. 1C) are then obtained as $$Z_{Out1}=R7+R4+R5+R6=Z_{L1} \text{ and}$$

$$Z_{Out2}=R9+R10+R11+R8=Z_{L2}.$$

In this case, in principle a plurality of possible values of the resistances R1 to R14 satisfy the condition for matching: $Z_{Out1}=Z_{Out2}=Z_{L1/2}$.

If the output impedances $Z_{Out1}$, $Z_{Out2}$ of the line driver S (cf. FIG. 1A), S' (cf. FIG. 1B), S" (cf. FIG. 1C) are considered during the switching phase, here as an example as far as the central point of the switching slope, that is, for example, at a control voltage decreasing from originally about 1.2 Volt to about 0.6 Volt (the output impedance can be determined at any other arbitrary operating point), the following states are obtained for this case (the voltage at the node C is assumed to be about 0.4 Volt as an example):

At the beginning of the switching slope, the first n-channel transistor T1 is located in its linear region (that is, begins its operation to a certain extent as a low-resistance switch in the conducting state), that is the drain source voltage is lower than the saturation voltage; as a result, the equivalent drain source resistance R2 of the first n-channel transistor T1 is very low, for example, about three Ohms.

Due to the decrease of the voltage at the first input connection $In_1 +$, the operating point of the first transistor T1 varies from operation in the linear region in which the drain degradation resistance R1 contributes approximately one hundred percent to the first output impedance $Z_{Out1}$, to operation as a source follower in saturation.

Due to this variation, the first drain degradation resistance R1 is almost ineffective for the first output impedance $Z_{Out1}$ (for example, only about ten-percent contribution of the first drain degradation resistance R1 to the first output impedance $Z_{Out1}$) because the first n-channel transistor T1 is now operating as a source follower ($\rightarrow$effect for $Z_{Out1}=R1 \cdot g_{DS}/g_m + R2_S+R3+R7$, wherein $g_{DS}$ is the drain source conductance and $g_m$ is the transconductance (the transconductance $g_m$, also known as the slew rate, is a characteristic which gives the ratio of output current to input voltage); in the example, $g_{DS}/g_m$ is about 0.1; $R2_S$ is to a good approximation equal to $g_m^{-1}$, is about fifteen Ohms and is greater than R2, being about three Ohms).

At the same time, the second n-channel transistor T2 operating in a regular source circuit begins to conduct but is located up to around the exemplary central point of the transition, that is for example at a control voltage of about 0.6 Volt, still in saturation. As long as the second n-channel transistor T2 is still in saturation, its output impedance is relatively high.

During this transition the second drain degradation resistance R9 is in the course of going over from a state which is ineffective for the second output impedance $Z_{Out2}$ into a state which contributes at least slightly to the second output impedance $Z_{Out2}$ when the operating point of the third transistor T3 changes from off-state to operation in the saturation region due to an increase in the control voltage at the third input connection $In_3 -$.

Consequently, a relatively high impedance exists between the node point A and the reference potential GND (=for example, earth potential or zero potential or ground), which is switched in parallel to the impedance between node point A and node point C but due to its high value has little influence on the actual output impedance $Z_{Out1}$.

As an approximation, the drain degradation resistance R1 can initially be selected to be approximately as large as the difference between R2 (<--->first transistor T1 in linear mode) and $R2_S$ (<--->first transistor T1 in saturation mode), for example, about twelve Ohms. Taking into account the additional parallel path R4-$R5_S$-R6, the drain degradation resistance R1 increases, for example, to about twenty Ohms.

By correctly selecting the drain degradation resistance R1, which is accomplished for example, by way of an iterative method, and the first separating resistance R3, it is now possible to adjust the output impedance $Z_{Out1}$ so that during the switching phase this retains the same value as during full-signal operation to a good approximation.

It is furthermore important for the correct adjustment of the resistances that by reducing the first output series resistance R7 and by simultaneously increasing the two separating resistances R3 and R4, the transverse currents flowing during the switching phase, in particular the current peaks which occur, are reduced and the impedance $Z_{Out1}$ can be reduced in the switching phase; the inverse holds for increasing the impedance $Z_{Out1}$ during the switching phase.

As a result of this degree of freedom, $Z_{Out1}$ can be achieved with high accuracy for all other operating points.

Another degree of freedom for the adjustment of the precise output impedance $Z_{Out1}$ can advantageously be obtained by control taking place at the first input connection $In_1 +$ and at the fourth input connection $In_4 +$ at phase-shifted times and these controls having respectively matched ascending and descending slopes; this implies a separate optimization of $In_1 +$ and $In_4 +$ (the same applies to the second input connection $In_2 -$ not described here and the third input connection $In_3 -$ not described here).

For the second path P2 of the differential circuit arrangement S or S' or S" or S'", not explicitly described previously, that is for the right half of FIG. 1A or FIG. 1B or FIG. 1C or FIG. 1D the preceding explanations apply accordingly.

The present invention is not only featured in that a low common mode output voltage can be achieved; rather, a very low power requirement can also be achieved with the present invention. Also, a very good output impedance matching and therefore a high reflection damping can be achieved during the switching phases as is advantageous (and necessary) for high data transmission rates.

In a preferred manner in the differential circuit arrangement S or S' or S" or S'", illustrated by reference to FIG. 1A or by reference to FIG. 1B or by reference to FIG. 1C or by reference to FIG. 1D which can expediently be connected downstream of at least one light-receiving component, for example of at least one photodiode, and supported by a decoupling capacitor, the voltage source SQ provides a voltage of about 0.4 Volt.

The choice of resistances R1 to R14 presented hereinbefore is recommended for matching the output impedances $Z_{Out1}$, $Z_{Out2}$ for the differential line to be connected; in this case, the resistances can be arranged, for example in the form of a star circuit (shown in FIG. 1B or in FIG. 1C) or in the form of a triangular circuit.

The differential circuit arrangement S according to FIG. 1A or S' according to FIG. 1B or S" according to FIG. 1C can be dimensioned according to the invention by means of the four re-channel M[etal-]O[xide]S[emiconductor] transistors T1, T2, T3, T4; thus, for example the first source degradation resistance R6 and/or the second source degradation resistance R14 can go to zero.

The present invention is preferably used for driving lines having a specific line impedance for the purpose of low-reflection and error-free digital data transmission from at least one data source, for example, from at least one first integrated circuit, to at least one data sink, for example, to at least one second integrated circuit.

While this invention has been described as having a preferred design, it is understood that it is capable of further modifications, and uses and/or adaptations of the invention and following in general the principle of the invention and including such departures from the present disclosure as come within the known or customary practice in the art to which the invention pertains, and as may be applied to the central features hereinbefore set forth, and fall within the scope of the invention.

LIST OF REFERENCE NUMERALS

A first node or first node point or first branch or first branch point
B second node or second node point or second branch or second branch point
C third node or third node point or third branch or third branch point
GND reference potential, in particular earth potential or ground potential or zero potential
In + input connection which can be acted upon by control voltage (=example from the PRIOR ART; cf. FIG. 2A), in particular first input connection which can be acted upon by first control voltage (=example from the PRIOR ART; cf. FIG. 2B, FIG. 2C, FIG. 2D)
In − second input connection which can be acted upon by second control voltage (=example from the PRIOR ART; cf. FIG. 2B, FIG. 2C, FIG. 2D)
$In_1$ + first input connection which can be acted upon by first control voltage
$In_2$ − second input connection which can be acted upon by second control voltage
$In_3$ − third input connection which can be acted upon by third control voltage
$In_4$ + fourth input connection which can be acted upon by fourth control voltage
KQ constant current source (=example from the PRIOR ART; cf. FIG. 2B, FIG. 2C)
Out + first output connection
Out − output connection (=example from the PRIOR ART; cf. FIG. 2A) or second output connection
P1 first path, in particular first signal path
P2 second path, in particular second signal path
R1 first drain degradation resistance
R2 drain-source resistance of first transistor T1
$R2_S$ drain-source resistance of first transistor T1 in saturation region
R3 first split resistance or first separating resistance
R4 second split resistance or second separating resistance
R5 drain-source resistance of second transistor T2
$R5_S$ drain-source resistance of second transistor T2 in saturation region
R6 first source degradation resistance
R7 first output series resistance
R8 second output series resistance
R9 second drain degradation resistance
R10 drain-source resistance of third transistor T3
$R10_S$ drain-source resistance of third transistor T3 in saturation region
R11 third split resistance or third separating resistance
R12 fourth split resistance or fourth separating resistance
R13 drain-source resistance of fourth transistor T4
$R13_S$ drain-source resistance of fourth transistor T4 in saturation region
R14 second source degradation resistance
S circuit arrangement, in particular line driver or driver output stage (=first exemplary embodiment; cf. FIG. 1A)
S' circuit arrangement, in particular line driver or driver output stage (=second exemplary embodiment; cf. FIG. 1B)
S" circuit arrangement, in particular line driver or driver output stage (=third exemplary embodiment; cf. FIG. 1C)
S'" circuit arrangement, in particular line driver or driver output stage (=fourth exemplary embodiment; cf. FIG. 1D)
SQ voltage source
T1 first transistor, in particular first M[etal-]O[xide]S[emiconductor-]F[ield-]E[ffect]T[ransistor], for example, first p-channel MOSFET (=example from the PRIOR ART; cf. FIG. 2A, FIG. 2C, FIG. 2D) or first n-channel MOSFET
T2 second transistor, in particular second M[etal-]O[xide]S[emiconductor-]F[ield-]E[ffect]T[ransistor], for example, second n-channel MOSFET
T3 third transistor, in particular third M[etal-]O[xide]S[emiconductor-]F[ield-]E[ffect]T[ransistor], for example, third p-channel MOSFET (=example from the PRIOR ART; cf. FIG. 2C, FIG. 2D) or third n-channel MOSFET
T4 fourth transistor, in particular fourth M[etal-]O[xide]S[emiconductor-]F[ield-]E[ffect]T[ransistor], for example, fourth n-channel MOSFET
$Z_L$ line impedance, in particular line input impedance (=example from the PRIOR ART; cf. FIG. 2A, FIG. 2B, FIG. 2C, FIG. 2D)
$Z_{Out}$ output impedance (=example from the PRIOR ART; cf. FIG. 2A, FIG. 2B, FIG. 2C, FIG. 2D)
$Z_{L1}$ first line impedance, in particular first line input impedance
$Z_{L2}$ second line impedance, in particular second line input impedance
$Z_{Out1}$ first output impedance
$Z_{Out2}$ second output impedance

What is claimed is:

1. A circuit having a controlled output impedance during all operating phases, including the positive and negative full-signal operation phases as well as the switching phases between said positive and negative full-signal operation phases, comprising:
   a) the circuit being configured for being supplied by a voltage source for driving at least one differential line which can be connected to at least one first output connection and to at least one second output connection for the purpose of digital data transmission;

b) the circuit having at least two paths which are arranged in a mirror-image fashion relative to one another and which connect the voltage source to at least one reference potential;
c) the first path including:
i) at least one first transistor including at least one first n-channel MOSFET, whose gate connection is assigned to at least one first input connection which can be acted upon by at least one first control voltage; and
ii) at least one second transistor including at least one second n-channel MOSFET, whose gate connection is assigned to at least one second input connection which can be acted upon by at least one second control voltage, and the first output connection is connected between the first transistor and the second transistor;
d) the second path including:
i) at least one third transistor including at least one third n-channel MOSFET, whose gate connection is assigned to at least one third input connection which can be acted upon by at least one third control voltage; and
ii) at least one fourth transistor including at least one fourth n-channel MOSFET, whose gate connection is assigned to at least one fourth input connection which can be acted upon by at least one fourth control voltage, and the second output connection is connected between the third transistor and the fourth transistor;
e) in the first path there is provided:
i) at least one first drain degradation resistance which is connected between the voltage source and the drain connection of the first transistor;
f) in the second path there is provided:
i) at least one second drain degradation resistance which is connected between the voltage source and the drain connection of the third transistor;
g) at least one first separating resistance is connected between the source connection of the first transistor and the first output connection, and at least one second separating resistance is connected between the drain connection of the second transistor and the first output connection; and
h) at least one third separating resistance is connected between the source connection of the third transistor and the second output connection, and at least one fourth separating resistance is connected between the drain connection of the fourth transistor and the second output connection.

2. The circuit according to claim 1, wherein:
a) the first drain degradation resistance is connected between at least one third node and the drain connection of the first transistor, and the source connection of the first transistor is immediately connected with at least one first node; and
b) the second drain degradation resistance is connected between the third node and the drain connection of the third transistor, and the source connection of the third transistor is immediately connected with at least one second node.

3. The circuit according to claim 1, wherein:
a) the first drain degradation resistance is connected between at least one third node and the drain connection of the first transistor, the first separating resistance is connected between the source connection of the first transistor and at least one first node, and the second separating resistance is connected between the first node and the drain connection of the second transistor; and
b) the second drain degradation resistance is connected between the third node and the drain connection of the third transistor, the third separating resistance is connected between the source connection of the third transistor and at least one second node, and the fourth separating resistance is connected between the second node and the drain connection of the fourth transistor.

4. The circuit according to claim 1, wherein:
a) at least one first source degradation resistance is provided which is connected between the source connection of the second transistor and the reference potential; and
b) at least one second source degradation resistance is provided which is connected between the source connection of the fourth transistor and the reference potential.

5. The circuit according to claim 1, wherein:
a) the circuit is configured for being used in at least one of a telecommunication system, a data communication system, a data processing device, a data recording device, a data reproducing device, and at least one transportation system.

6. A method for driving at least one differential line by use of at least one circuit:
a) the at least one circuit having a controlled output impedance during all operating phases, including the positive and negative full-signal operation phases as well as the switching phases between said positive and negative full-signal operation phases, and:
b) the at least one circuit being configured for being supplied by a voltage source for driving at least one differential line which can be connected to at least one first output connection and to at least one second output connection for the purpose of digital data transmission;
c) the at least one circuit having at least two paths which are arranged in a mirror-image fashion relative to one another and which connect the voltage source to at least one reference potential;
i) the first path including:
1) at least one first transistor including at least one first n-channel MOSFET, whose gate connection is assigned to at least one first input connection which can be acted upon by at least one first control voltage; and
2) at least one second transistor including at least one second n-channel MOSFET, whose gate connection, is assigned to at least one second input connection which can be acted upon by at least one second control voltage, and the first output connection is connected between the first transistor and the second transistor;
ii) the second path including:
1) at least one third transistor including at least one third n-channel MOSFET, whose gate connection is assigned to at least one third input connection which can be acted upon by at least one third control voltage; and
2) at least one fourth transistor including at least one fourth n-channel MOSFET, whose gate connection, is assigned to at least one fourth input connection which can be acted upon by at least one fourth control voltage, and the second output connection is connected between the third transistor and the fourth transistor;
iii) in the first path there is provided:
1) at least one first drain degradation resistance which is connected between the voltage source and the drain connection of the first transistor; and
iv) in the second path there is provided:
1) at least one second drain degradation resistance which is connected between the voltage source and the drain connection of the third transistor;
d) at least one first separating resistance is connected between the source connection of the first transistor and the first output connection, and at least one second separating resistance is connected between the drain connection of the second transistor and the first output connection; and e) at least one third separating resistance is connected between the source connection of the third transistor and the second output connection, and at least one fourth separating resistance is connected between the drain connection of the fourth transistor and the second output connection;

the method comprising:
a) in the range of positive full-signal operation:
 i) the first transistor and the fourth transistor are located in the linear region and conduct; and
 ii) the second transistor and the third transistor are in the off-state;
b) in the range of negative full-signal operation:
 i) the first transistor and the fourth transistor are in the off-state; and
 ii) the second transistor and the third transistor are located in the linear region and conduct; and
c) in the transition range between positive full-signal operation and negative full-signal operation:
 i) due to decrease of the input voltage at the first input connection, the operating point of the first transistor changes from operation in the linear region to operation as a source follower in saturation;
 ii) the second transistor still remains in saturation when the input voltage at the second input connection increases as far as about the central point of the transition range;
 iii) the third transistor still remains in saturation when the input voltage at the third input connection increases as far as about the central point of the transition range; and
 iv) due to a decrease in the input voltage at the fourth input connection, the operating point of the fourth transistor changes from operation in the linear region to operation in saturation.

7. The method according to claim 6, wherein:
a) in the case of positive full-signal operation, the respective control voltage is:
 i) about 1.2 Volt for the first input connection;
 ii) about 0 Volt for the second input connection;
 iii) about 0 Volt for the third input connection;
 iv) about 1.2 Volt for the fourth input connection;
b) in the case of negative full-signal operation, the respective control voltage is:
 i) about 0 Volt for the first input connection;
 ii) about 1.2 Volt for the second input connection;
 iii) about 1.2 Volt for the third input connection; and
 iv) about 0 Volt for the fourth input connection.

8. The method according to claim 6, wherein:
a) the first drain degradation resistance is approximately as large as the difference between the drain-source resistance of the first transistor in the linear region and the drain-source resistance of the first transistor in the saturation region and is increased taking into account the parallel branch of second separating resistance, drain-source resistance of the second transistor in the saturation region and first source degradation resistance; and
b) the second drain degradation resistance is approximately as large as the difference between the drain-source resistance of the third transistor in the linear region and the drain-source resistance of the third transistor in the saturation region and is increased taking into account the parallel branch of fourth separating resistance, drain-source resistance of the fourth transistor in the saturation region and second source degradation resistance.

9. The method according to claim 6, wherein:
a) by increasing the first separating resistance and the second separating resistance in the transition region transverse currents flowing in the first path are reduced; and
b) by increasing the third separating resistance and the fourth separating resistance in the transition region transverse currents flowing in the second path are reduced.

10. The method according to claim 6, wherein:
a) by reducing a first output series resistance in a transition region, a first output impedance is reduced; and
b) by reducing a second output series resistance in the transition region, a second output impedance is reduced.

11. The method according to claim 6, wherein:
a) the first input connection and the fourth input connection are controlled in a phase-shifted manner; and
b) the second input connection and the third input connection are controlled in a phase-shifted manner.

12. A circuit having a controlled output impedance during all operating phases, including the positive and negative full-signal operation phases as well as the switching phases between said positive and negative full-signal operation phases, comprising:
a) the circuit being configured for being supplied by a voltage source for driving at least one differential line which can be connected to at least one first output connection and to at least one second output connection for the purpose of digital data transmission;
b) the circuit having at least two paths which are arranged in a mirror-image fashion relative to one another and which connect the voltage source to at least one reference potential;
c) the first path including:
 i) at least one first transistor including at least one first n-channel MOSFET, whose gate connection is assigned to at least one first input connection which can be acted upon by at least one first control voltage; and
 ii) at least one second transistor including at least one second n-channel MOSFET, whose gate connection is assigned to at least one second input connection which can be acted upon by at least one second control voltage, and the first output connection is connected between the first transistor and the second transistor;
d) the second path including:
 i) at least one third transistor including at least one third n-channel MOSFET, whose gate connection is assigned to at least one third input connection which can be acted upon by at least one third control voltage; and
 ii) at least one fourth transistor including at least one fourth n-channel MOSFET, whose gate connection is assigned to at least one fourth input connection which can be acted upon by at least one fourth control voltage, and the second output connection is connected between the third transistor and the fourth transistor;
e) in the first path there is provided:
 i) at least one first drain degradation resistance which is connected between the voltage source and the drain connection of the first transistor;
f) in the second path there is provided:
 i) at least one second drain degradation resistance which is connected between the voltage source and the drain connection of the third transistor;

g) at least one first output series resistance is connected between the first transistor, the second transistor and the first output connection; and
h) at least one second output series resistance is connected between the third transistor, the fourth transistor and the second output connection.

13. The circuit according to claim 12, wherein:
a) at least one first separating resistance is connected between the source connection of the first transistor and the first output connection, and at least one second separating resistance which is connected between the drain connection of the second transistor and the first output connection; and
b) at least one third separating resistance is connected between the source connection of the third transistor and the second output connection, and at least one fourth separating resistance which is connected between the drain connection of the fourth transistor and the second output connection.

14. The circuit according to claim 12, wherein:
a) the first output series resistance is connected between the source connection of the first transistor, the drain connection of the second transistor and the first output connection; and
b) the second output series resistance is connected between the source connection of the third transistor, the drain connection of the fourth transistor and the second output connection.

15. The circuit according to claim 12, wherein:
a) the circuit is configured for being used in at least one of a telecommunication system, a data communication system, a data processing device, a data recording device, a data reproducing device, and at least one transportation system.

16. A method for driving at least one differential line by use of at least one circuit:
a) the at least one circuit having a controlled output impedance during all operating phases, including the positive and negative full-signal operation phases as well as the switching phases between said positive and negative full-signal operation phases, and:
b) the at least one circuit being configured for being supplied by a voltage source for driving at least one differential line which can be connected to at least one first output connection and to at least one second output connection for the purpose of digital data transmission;
c) the at least one circuit having at least two paths which are arranged in a mirror-image fashion relative to one another and which connect the voltage source to at least one reference potential;
i) the first path including:
1) at least one first transistor including at least one first n-channel MOSFET, whose gate connection is assigned to at least one first input connection which can be acted upon by at least one first control voltage; and
2) at least one second transistor including at least one second n-channel MOSFET, whose gate connection, is assigned to at least one second input connection which can be acted upon by at least one second control voltage, and the first output connection is connected between the first transistor and the second transistor;
ii) the second path including:
1) at least one third transistor including at least one third n-channel MOSFET, whose gate connection is assigned to at least one third input connection which can be acted upon by at least one third control voltage; and
2) at least one fourth transistor including at least one fourth n-channel MOSFET, whose gate connection, is assigned to at least one fourth input connection which can be acted upon by at least one fourth control voltage, and the second output connection is connected between the third transistor and the fourth transistor;
iii) in the first path there is provided:
1) at least one first drain degradation resistance which is connected between the voltage source and the drain connection of the first transistor; and
iv) in the second path there is provided:
1) at least one second drain degradation resistance which is connected between the voltage source and the drain connection of the third transistor; and
the method comprising:
a) in the range of positive full-signal operation:
i) the first transistor and the fourth transistor are located in the linear region and conduct; and
ii) the second transistor and the third transistor are in the off-state;
b) in the range of negative full-signal operation:
i) the first transistor and the fourth transistor are in the off-state; and
ii) the second transistor and the third transistor are located in the linear region and conduct; and
c) in the transition range between positive full-signal operation and negative full-signal operation:
i) due to decrease of the input voltage at the first input connection, the operating point of the first transistor changes from operation in the linear region to operation as a source follower in saturation;
ii) the second transistor still remains in saturation when the input voltage at the second input connection increases as far as about the central point of the transition range;
iii) the third transistor still remains in saturation when the input voltage at the third input connection increases as far as about the central point of the transition range; and
iv) due to a decrease in the input voltage at the fourth input connection, the operating point of the fourth transistor changes from operation in the linear region to operation in saturation;
d) the first drain degradation resistance for a first output impedance is almost ineffective when the operating point of the first transistor changes from operation in the linear region to operation in the saturation region due to a decrease in the input voltage at the first input connection; and
e) the second drain degradation resistance is in the course of going over from an ineffective state for the second output impedance into a state which contributes slightly to the second output impedance when the operating point of the third transistor changes from the off-state to operation in the saturation due to an increase in the input voltage at the third input connection.

17. The method according to claim 16, wherein:
a) at least one first separating resistance is connected between the source connection of the first transistor and the first output connection, and at least one second separating resistance is connected between the drain connection of the second transistor and the first output connection; and
b) at least one third separating resistance is connected between the source connection of the third transistor and the second output connection, and at least one fourth separating resistance is connected between the drain connection of the fourth transistor and the second output connection.

18. The method according to claim 17, wherein:

a) the first drain degradation resistance is approximately as large as the difference between the drain-source resistance of the first transistor in the linear region and the drain-source resistance of the first transistor in the saturation region and is increased taking into account the parallel branch of second separating resistance, drain-source resistance of the second transistor in the saturation region and first source degradation resistance; and b) the second drain degradation resistance is approximately as large as the difference between the drain-source resistance of the third transistor in the linear region and the drain-source resistance of the third transistor in the saturation region and is increased taking into account the parallel branch of fourth separating resistance, drain-source resistance of the fourth transistor in the saturation region and second source degradation resistance.

19. The method according to claim 17, wherein:

a) by increasing the first separating resistance and the second separating resistance in the transition region transverse currents flowing in the first path are reduced; and b) by increasing the third separating resistance and the fourth separating resistance in the transition region transverse currents flowing in the second path are reduced.

20. The method according to claim 16, wherein:

a) by reducing a first output series resistance in a transition region, a first output impedance is reduced; and b) by reducing a second output series resistance in the transition region, a second output impedance is reduced.

21. The method according to claim 16, wherein:

a) the first input connection and the fourth input connection are controlled in a phase-shifted manner; and b) the second input connection and the third input connection are controlled in a phase-shifted manner.

\* \* \* \* \*